United States Patent
Atashbar et al.

(10) Patent No.: US 10,466,287 B2
(45) Date of Patent: Nov. 5, 2019

(54) PRINTED WIRELESS INDUCTIVE-CAPACITIVE (LC) SENSOR FOR HEAVY METAL DETECTION

(71) Applicant: The Board of Trustees of Western Michigan University, Kalamazoo, MI (US)

(72) Inventors: Massood Zandi Atashbar, Portage, MI (US); Sai Guruva Reddy Avuthu, Mt. Pleasant, MI (US); Binu Baby Narakathu, Kalamazoo, MI (US)

(73) Assignee: The Board of Trustees of Western Michigan University, Kalamazoo, MI (US)

( * ) Notice: Subject to any disclaimer, the term of this patent is extended or adjusted under 35 U.S.C. 154(b) by 260 days.

(21) Appl. No.: 15/595,243

(22) Filed: May 15, 2017

(65) Prior Publication Data
US 2017/0328941 A1    Nov. 16, 2017

Related U.S. Application Data

(60) Provisional application No. 62/336,178, filed on May 13, 2016.

(51) Int. Cl.
*G01R 27/26* (2006.01)
*G01R 27/06* (2006.01)
(Continued)

(52) U.S. Cl.
CPC .......... *G01R 27/267* (2013.01); *G01R 27/06* (2013.01); *H01L 51/0022* (2013.01);
(Continued)

(58) Field of Classification Search
CPC ........ G01R 27/00; G01R 27/02; G01R 27/04; G01R 27/06; G01R 27/26; G01R 27/2617;
(Continued)

(56) References Cited

U.S. PATENT DOCUMENTS 6,278,379 B1 * 8/2001 Allen .................. B60C 23/0408
324/655
6,819,120 B2 * 11/2004 Tam ...................... G01N 27/023
324/633

(Continued)

OTHER PUBLICATIONS

Morton et al., "Detection of trace heavy metal ions using carbon nanotube-modified electrodes", Electroanalysis, vol. 21, pp. 1597-1603, 2009, 7 pages.

(Continued)

*Primary Examiner* — Hoai-An D. Nguyen
(74) *Attorney, Agent, or Firm* — Price Heneveld LLP

(57) ABSTRACT

An inductive-capacitive (LC) wireless sensor for the detection of toxic heavy metal ions includes inductors and interdigitated electrodes (IDE) in planar form. The sensor is fabricated by screen printing silver (Ag) ink onto a flexible polyethylene-terephthalate (PET) substrate to form a metallization layer. Palladium nanoparticles (Pd NP) is drop casted onto the IDEs to form a sensing layer. The resonant frequency of the LC sensor is remotely monitored by measuring the reflection coefficient ($S_{11}$) of a detection coil (planar inductor). The resonant frequency of the LC sensor changes with varying concentrations of heavy metals such as mercury ($Hg^{2+}$) and lead ($Pb^{2+}$) ions. Changes in the resonant frequency are used to detect the presence and/or concentration of heavy metal ions.

20 Claims, 7 Drawing Sheets

(51) Int. Cl.
*H01L 51/00* (2006.01)
*H01L 51/05* (2006.01)
*H01L 51/10* (2006.01)
*B82Y 15/00* (2011.01)

(52) U.S. Cl.
CPC ........ *H01L 51/0575* (2013.01); *H01L 51/105* (2013.01); *B82Y 15/00* (2013.01); *H01L 51/0004* (2013.01)

(58) Field of Classification Search
CPC .............. G01R 27/2623; G01R 27/267; H01L 51/0004; H01L 51/0022; H01L 51/0575; H01L 51/105; B82Y 15/00
USPC ......... 324/76.11, 76.39, 76.49, 76.51, 76.75, 324/207.15, 500, 533, 534, 600, 629, 633, 324/637, 638, 642, 646, 649, 652, 654, 324/655, 658, 668, 675, 681, 682, 707, 324/708
See application file for complete search history.

(56) References Cited

U.S. PATENT DOCUMENTS

| | | | | |
|---|---|---|---|---|
| 6,891,380 | B2* | 5/2005 | Kesil | G01B 7/105 |
| | | | | 324/230 |
| 8,795,484 | B2 | 8/2014 | Stetter et al. | |
| 8,999,431 | B2 | 4/2015 | Nagarajan et al. | |
| 9,038,483 | B2* | 5/2015 | Nagarajan | G01B 7/16 |
| | | | | 324/207.15 |
| 9,125,625 | B2 | 9/2015 | Wang et al. | |
| 2006/0275549 | A1* | 12/2006 | Subramanian | B82Y 30/00 |
| | | | | 427/282 |
| 2009/0109035 | A1* | 4/2009 | Subramanian | G08B 13/242 |
| | | | | 340/572.8 |
| 2011/0318695 | A1* | 12/2011 | Hwang | B82Y 30/00 |
| | | | | 430/322 |
| 2012/0166095 | A1* | 6/2012 | Potyrailo | G01N 27/3278 |
| | | | | 702/23 |
| 2013/0062211 | A1 | 3/2013 | Deshusses et al. | |
| 2015/0053554 | A1 | 2/2015 | Kawde et al. | |
| 2015/0121992 | A1 | 5/2015 | Xiao | |
| 2015/0123678 | A1* | 5/2015 | Neikirk | G01N 27/08 |
| | | | | 324/636 |
| 2015/0126834 | A1 | 5/2015 | Wang et al. | |

OTHER PUBLICATIONS

Zheng et al. "Liquid crystal-based sensors for the detection of heavy metals using surface-immobilized urease", Colloids Surf., B, vol. 88, pp. 622-626, 2011, 5 pages.
M. Souiri, et .al., "*Escherichia coli*—functionalized magnetic nanobeads as an ultrasensitive biosensor for heavy metals", Procedia Chem, pp. 1027-1030, 2009, 4 pages.
Wu et al., "Highly sensitive multiplexed heavy metal detection using quantum-dot-labeled DNAzymes", ACS Nano, vol. 4, pp. 5897-5904, 2010.
Ganesan et al., "Monodisperse thioetherstabilized palladium nanoparticles: synthesis, characterization, and reactivity", Chem. Mat., vol. 19, pp. 3464-3471, 2007.
Li et al., "Facile Synthesis of Silver Nanoparticles Useful for Fabrication of High-Conductivity Elements for Printed Electronics," American Chemical Society, pp. 3266-3267, 2005, 2 pages.
Yugang Sun and H. Hau Want, "Electrodeposition of Pd nanoparticles on single-walled carbon nanotubes for flexible hydrogen sensors," Applied Physics Letters, 2007, 4 pages.
Lim et al., "Screen Printed Resonant Tags for Electronic Article Surveillance Tags," IEEE, vol. 32, No. 1, Feb. 2009, 5 pages.
Narakathu et al., "Novel fully screen printed flexible electrochemical sensor for the investigation of electron transfer between thiol functionalized viologen and gold clusters," Oct. 22, 2012, 7 pages.
Reddy et al., "Fully printed wireless LC sensor for heavy metal detection," May 15, 2015, 4 pages.
Avuthu et al., "Detection of Heavy Metal Ions Using Screen Printed Wireless LC Sensor", IEEE Sensors 2015, Nov. 1-14, 2015, Busan, South Korea (20 pages).
Avuthu, "Implementation of Traditional Printing Techniques for the Development of Flexible Printed Sensors", Western Michigan University, ScholarWorks at WMU, Dissertations, Paper 578, Jun. 2015 (186 pages).
W Mokwa, "Medical implants based on microsytems", IOP Publishing, Measurement Science and Technology, published Mar. 6, 2007 (12 pages).
Reese et al., "Organic thin film transistors", Materialstoday, Sep. 2004, pp. 20-27.
Kaiser et al., "Passive Telemetric Readout System", IEEE Sensors Journal, vol. 6, No. 5, Oct. 2006, pp. 1340-1345.
Reddy et al., "Printed Capacitive Based Humidity Sensors on Flexible Substrates", American Scientific Publishers, Sensors Letters vol. 9, 869-871, 2011.
Robert et al., "Flexible, plastic transistor-based chemical sensors", Organic Electronics 10 (2009) 377-383.
Eshkeiti et al., "Screen Printing of Multilayered Hybrid Printed Circuit Boards on Different Substrates", IEEE Transactions on Components, Packaging and Manufacturing Technology, vol. 5, No. 3, Mar. 2005 pp. 415-421.
Fay et al., Wireless aquatic navigator for detection and analysis (WANDA), Sensors and Actuators B 150 (2010) 425-435.
Adams et al, "Size-Dependent Antimicrobial Effects of Novel Palladium Nanoparticles", PLos ONe 9(1): e85981. doi:10.1371/journal.pone.0085981 (12 pages).
Eshkeiti et al.,"Detection of heavy metal compounds using a novel inkjet printed surface enhanced Raman spectroscopy (SERS) substrate," Sens. Actuat. B: Chem., vol. 171-172, pp. 705-711, Mar. 2012.
Narakathu et al., "Improved detection limits of toxic biochemical species based on impedance measurements in electrochemical biosensors," Biosens Bioelectron., vol. 26, pp. 923-928, Apr. 2010.
Gammoudi et al., "Love-wave bacteria-based sensor for the detection of heavy metal toxicity in liquid medium," Biosens Bioelectron., vol. 26, pp. 1723-1726, Apr. 2010.
Aragay et al., "Recent Trends in Macro-, Micro-, and Nanomaterial-Based Tools and Strategies for Heavy-Metal Detection," Chem. Rev., vol. 111, pp. 3433-3458, Mar. 11, 2011.
Abbaspour et al., "Speciation of iron(II), iron(III) and full-range pH monitoring using paptode: A simple colorimetric method as an appropriate alternative for optodes," Sens. Actuators, B, vol. 113, pp. 857-865, Jun. 29, 2005.
Raju et al., "Spectrophotomeric Titration of Resorufin and Resazurin with Iron (II) in Strong Phosphoric Acid Medium and Resorufin as a new Redox Indicator in the Reductimetric Titration of Some Metal Ions," Asian J. Chem., vol. 19, pp. 683-692, Jun. 30, 2006.
Mieyeville, et al., "Wireless sensor networks for active vibration control in automobile structures," Smart Mat. & Struct., vol. 21, Jun. 7, 2012 (14 pages).

* cited by examiner

PRINTED WIRELESS INDUCTIVE-CAPACITIVE (LC) SENSOR FOR HEAVY METAL DETECTION

CROSS REFERENCE TO RELATED APPLICATION

This application claims the benefit of U.S. Provisional Application No. 62/336,178 filed on May 13, 2016, entitled, "PRINTED WIRELESS INDUCTIVE-CAPACITIVE (LC) SENSOR FOR HEAVY METAL DETECTION," the entire contents of which are incorporated herein by reference.

STATEMENT REGARDING PRIOR DISCLOSURES BY THE INVENTOR OR A JOINT INVENTOR

Sai Guruva Reddy Avuthu, "Implementation of Traditional Printing Techniques for the Development of Flexible Printed Sensors", Western Michigan University, ScholarWorks at WMU, Dissertations, Paper 578, June 2015 (186 pages)

The author of this document, Sai Guruva Reddy Avuthu, is an inventor in the present patent application and in U.S. Provisional Application No. 62/336,178, filed on May 13, 2016.

BACKGROUND OF THE INVENTION

Heavy metals are major environmental pollutants, both in land and water. Heavy metal contamination is a threat because these metals are toxic and nonbiodegradable and therefore remain in the ecosystem and food chain. The toxicity of heavy metals may depend on the concentration of the heavy metal. For example, low concentrations of heavy metals such as zinc, iron and copper, are biologically essential. However, these metals may be toxic at higher concentrations. Heavy metals such as mercury and lead are not biologically essential and may cause various diseases in humans and animals, even at micro molar concentration levels.

Various techniques such as colorimetric analysis, impedance spectroscopy, Raman spectroscopy and titration have been used to detect heavy metals. However, known techniques may suffer from various drawbacks. For example, known heavy metal detection techniques may require complicated instrumentation, and may involve high manufacturing and operational costs.

BRIEF SUMMARY OF THE INVENTION

A fully printed wireless inductive-capacitive (LC) sensor for the detection of toxic heavy metal ions includes inductors and interdigitated electrodes (IDE) in a generally planar form. The sensor may be fabricated by screen printing silver (Ag) ink onto a flexible polyethylene-terephthalate (PET) substrate to form a conductive (metallization) layer. Palladium nanoparticles (Pd NP) may be drop casted onto the IDEs to form a sensing layer. The resonant frequency of the LC sensor may be remotely monitored by measuring the reflection coefficient ($S_{11}$) of a detection coil (planar inductor). The resonant frequency of the LC sensor changes with varying concentrations of heavy metals such as mercury ($Hg^{2+}$) and lead ($Pb^{2+}$) ions. Changes in the resonant frequency may be used to detect the presence and/or concentration of heavy metal ions. The sensor may provide micro molar detection levels.

These and other features, advantages, and objects of the present invention will be further understood and appreciated by those skilled in the art by reference to the following specification, claims, and appended drawings.

DETAILED DESCRIPTION

Figure 1B:
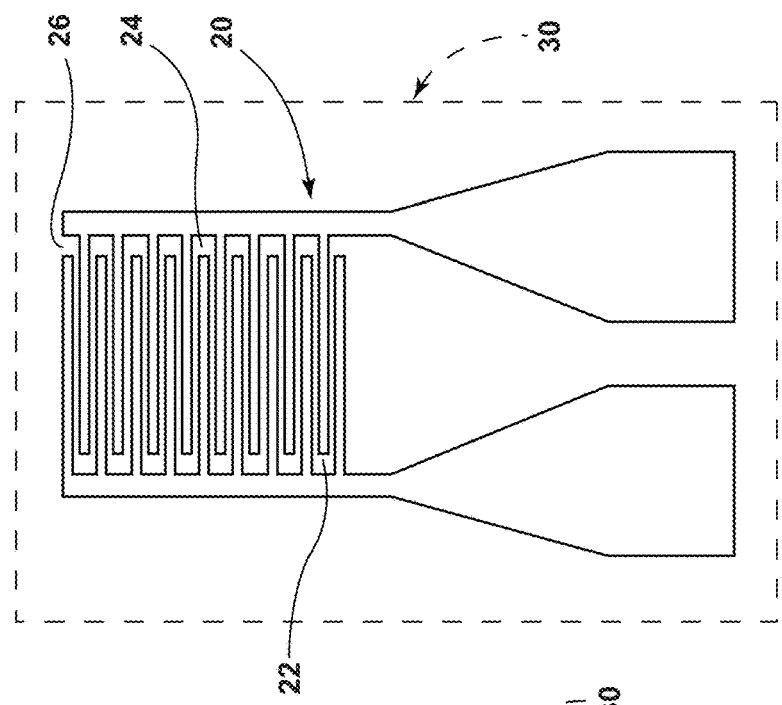
FIG. 1b is a schematic of an interdigitated electrode (IDE) capacitor.
Figure 1A:
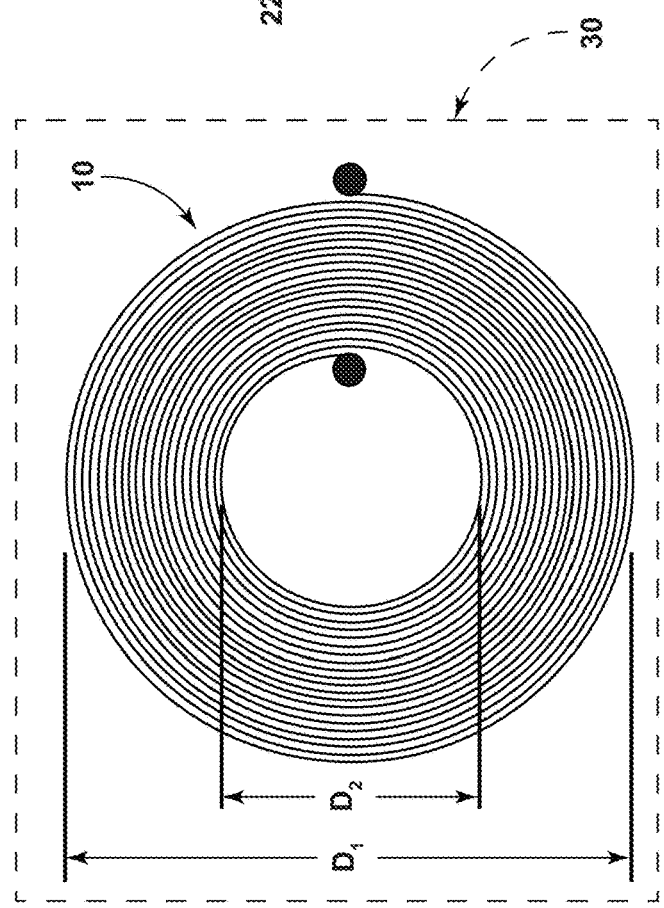
FIG. 1a is a coplanar inductor.

For purposes of description herein, the terms "upper," "lower," "right," "left," "rear," "front," "vertical," "horizontal," and derivatives thereof shall relate to the invention as oriented in FIGS. 1(a) and 1(b), wherein "up" is generally out of the plane of the drawing, and "down" is into the plane of the drawing. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Recent advancements in the sensor industry have led to the emergence of wireless sensors, which have been used in both active and passive modes. Passive sensors may have advantages relative to active wireless sensors because passive sensors use a basic inductive capacitor (LC) circuit as a sensor. In contrast, active sensors typically include numerous components such as batteries, amplifiers, antennas and radio frequency (RF) circuits that tend to make the sensor systems more complex and expensive. Known LC sensors may be fabricated using traditional photolithography techniques. Photolithography requires complex fabrication steps and high operating temperatures, which typically results in costly processes. Fabrication of electronics using conventional printing techniques may provide for fabrication of low cost wireless passive sensors.

In the present disclosure, screen printing may be used for fabricating a wireless LC sensor on flexible polyethylene-terephthalate (PET) substrate. One or more Planar inductors and one or more interdigitated electrode (IDE) capacitors may be screen printed using silver (Ag) ink as a metallization layer. Palladium nanoparticles (Pd NP) may be synthesized and drop casted onto the IDEs to form a sensing layer for the detection of heavy metal ions. As discussed in more detail below, the change in resonant frequency of the LC sensor changes with varying concentrations of the heavy metal ions such as mercury ($Hg^{2+}$) and lead ($Pb^{2+}$) ions, and this change in resonant frequency may be utilized to detect the presence and/or concentration of heavy metal ions.

Example

A. Materials, Chemicals and Sample Preparation

Melinex® ST 505, a flexible PET of 130 µm thickness, (available from DuPont Teijin Films) was used as the substrate. A silver flake ink (Henkel Electrodag 479SS) was used for metalizing the coplanar LC sensor. Dodecyl sulfide, Mercury nitrate ($Hg(NO_3)_2$), and Lead Nitrate ($Pb(NO_3)_2$) (all in powder form) were purchased from Sigma-Aldrich chemical company. Palladium acetate [$Pd_3(OAc)_6$] was purchased from Strem Chemicals (Newbury Port, Mass.). Various concentrations of $Hg^{2+}$ and $Pb^{2+}$ (1 nM, 1 µM, 50 µm, 250 µm, 500 µm, 750 µm and 1 mM) were prepared by dissolving mercury nitrate ($Hg(NO_3)_2$) and lead nitrate ($Pb(NO_3)_2$) in deionized (DI) water. The prepared solutions were stored in 10 mL aliquots at 2° C.

B. Synthesis of Pd NPs

Pd NPs were used as sensing layers for the detection of heavy metal ions. Pd NPs are synthesized by modified pyrolysis reaction. 0.05 g of 0.075 mM $Pd_3(OAc)_6$ and 0.14 g of 0.37 mM n-dodecyl sulfide was added to 30 mL of ethanol. The reaction mixture was heated at 90° C. for 1 hour resulting in a color change of the solution from orange to dark brown indicating NP formation. The solution was then diluted with 300 mL of milli-Q water (18 MΩ·cm). The synthesized Pd NPs of this example have a spherical shape with 2 nm diameter. However, Pd NPs having diameters in the range of 1-2 nm or 1-10 nm may also be utilized. The synthesis of Pd NP compounds has been reported previously, such that a more detailed description of the process is not believed to be required.

A range of 1-2 nm is presently preferred as it is believed to optimize electrochemical behavior. In general, nanoparticles are sensitive to their local environment, and changes in the dielectric constant changes the characteristics of the nanoparticles. Pd NPs having diameters in the 1-2 nm range generally exhibit molecule-like behavior, not metal-like behavior. This allows the Pd NPs to exhibit electrochemical properties. Significantly, the electrochemical properties of the Pd NPs are affected by the local environment. Larger particles having metal-like properties may not provide significant electrochemical properties.

C. Screen Printing of Wireless LC Sensor

The inductor and capacitor for the LC sensor was designed in CoventorWare®. A schematic of a coplanar inductor 10 is shown in FIG. 1(*a*). The coplanar inductors 10 and 34 (see also FIG. 3) comprises electrode dimensions of 175 µm line width and 350 µm spacing, 43,000 µm outer diameter D1, 22,000 µm inner diameter D2 and 20 turns. With reference to FIG. 1(*b*), a capacitor 20 includes coplanar IDEs comprising 9 pairs of interdigitated electrodes 22 and 24. Electrodes 22 and 24 have a length of 5200 µm, with 200 µm electrode width and spacing.

A 12"×12" stainless steel screen (not shown) with 325 mesh count and 28 µm wire diameter resulting in open area of 41% was fabricated at MicroScreen®, USA. A screen printer (AMI MSP 485) from Affiliated Manufacturers Inc. was used to deposit AG flake ink onto PET 30 to form the coplanar inductor 10 and IDEs 20. The PET 30 was cleaned with isopropyl alcohol (IPA) before printing. The printed layers were thermally cured in a conventional oven at 90° C. for 25 minutes.

Figure 2A:
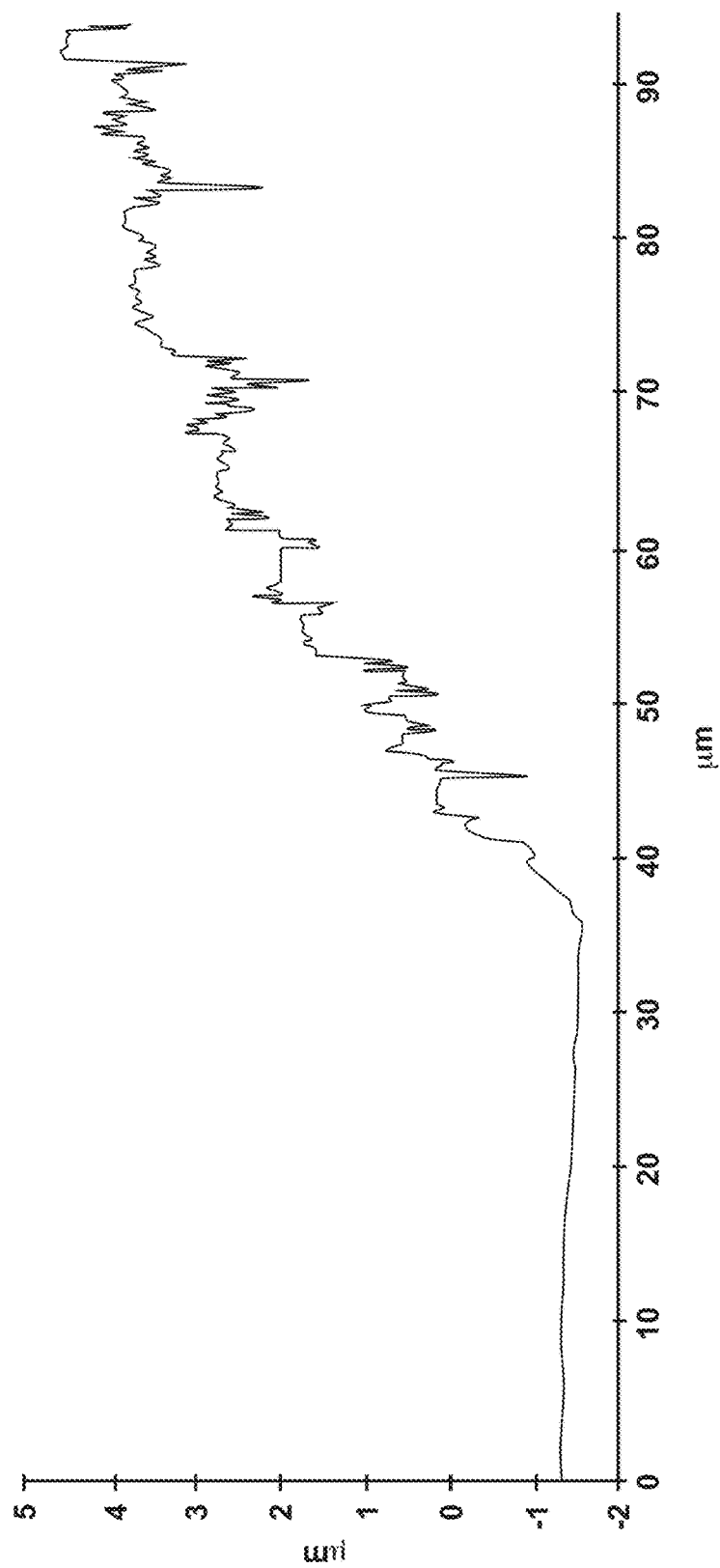
FIG. 2a is a graph showing thickness of the screen printed electrodes.
Figure 2B:
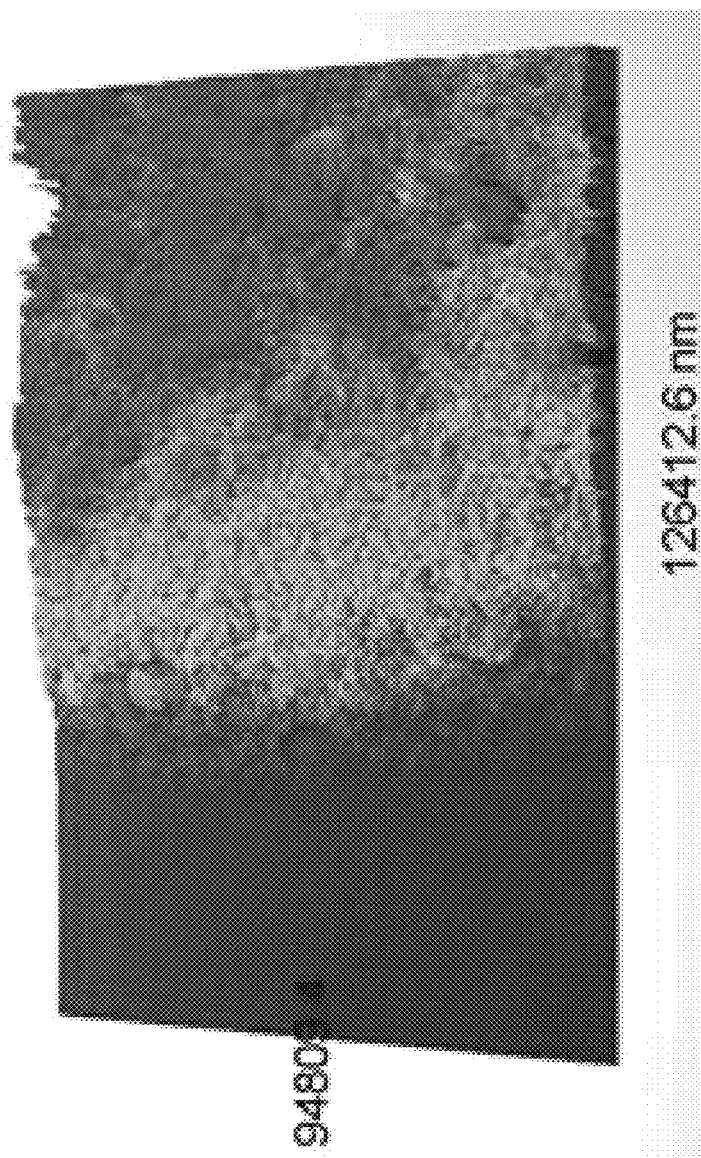
FIG. 2b shows the 3D topography of the printed electrodes.

With reference to FIGS. 2(*a*) and 2(*b*), vertical scanning interferometry 3D topography of the printed electrodes was measured using a Bruker Contour GT-K profilometer (available from Bruker Biosciences Corporation, USA), with Bruker Vision software operating in hybrid mode. The average thickness and RMS roughness of the printed electrodes were measured as 6.7±1.4 µm and 0.84±0.1 µm, respectively. The measured value of inductance and capacitance are 4.8±0.15 µH and 4.21±0.1 pF, respectively. The calculated resonant frequency from the measured capacitance and inductance value is 35.3±1.2 MHz.

D. Experiment Procedures

Figure 3:
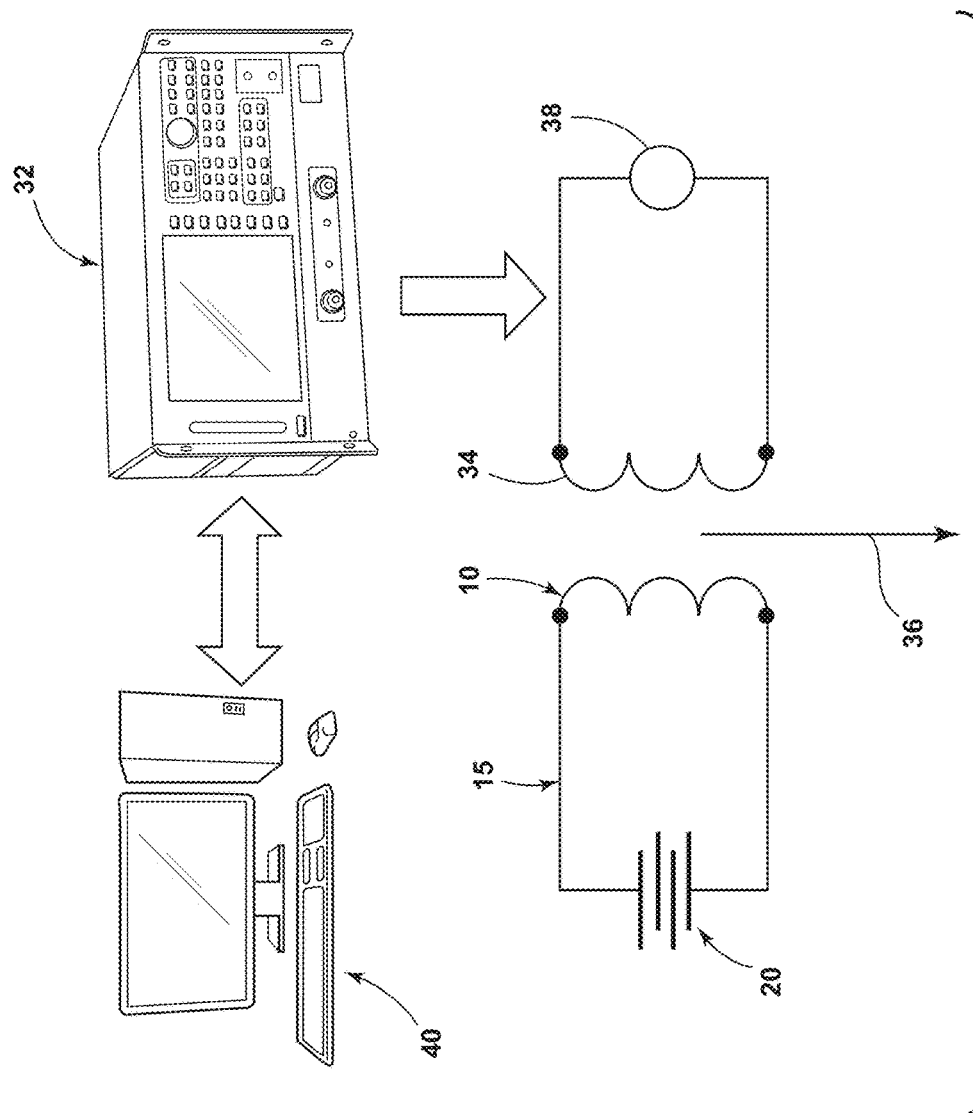
FIG. 3 is a schematic view of an experimental setup utilized to test a passive LC sensor.
Figure 4:
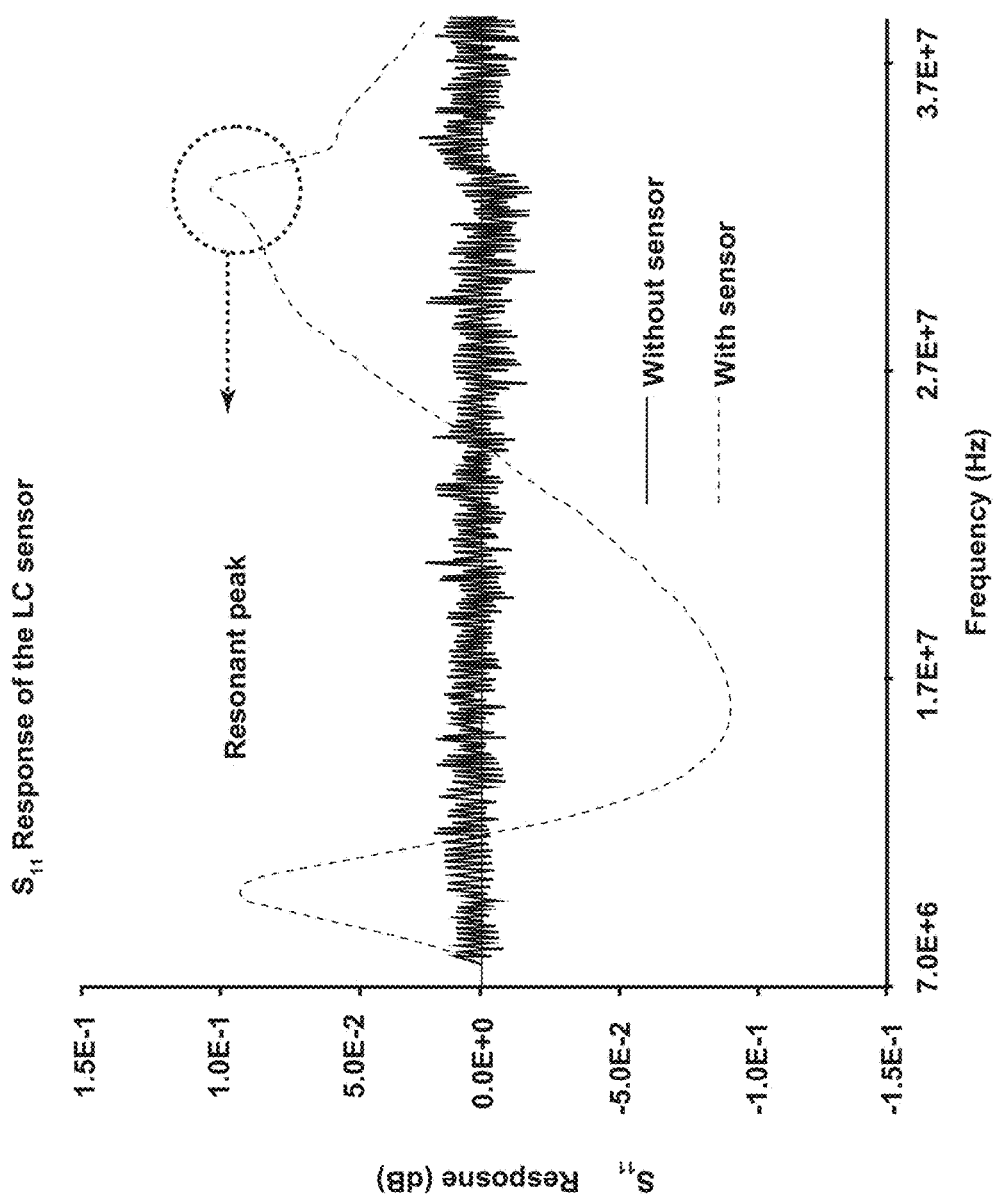
FIG. 4 shows the measured $S_{11}$ of the detection coil with and without the presence of LC sensor.

First, the sensor surface was prepared for the detection of $Pb^{2+}$ and $Hg^{2+}$. 40 µL of Pd NPs in ethanol was drop casted onto the IDEs 26 at 100° C. to form sensing layers for $Hg^{2+}$ and $Pb^{2+}$ detection. Then, the IDEs 26 were attached to the screen printed inductors 10 using jumper wires and conductive silver epoxy (e.g. CW-2400, available from CircuitWorks®) to form the LC sensor 15 (FIG. 3). The printed wireless sensor 15 was remotely interrogated with a printed detection coil 10 (screen printed planar inductor) by measuring $S_{11}$ using an Agilent network analyzer (4395A) 32 utilizing the experimental setup shown in FIG. 3. Network analyzer 32 provides a voltage source 38. The signal in the network analyzer 32 was averaged 50 times before taking the measurements. Calibration for wires and probes was also done before taking measurements. The passive LC sensor 15 and the detection coil 10 were placed in the same axis, with a separation distance of 3 mm to form a wireless connection 36. The response of the LC sensor 15 was studied by measuring $S_{11}$ of the detection coil 10. The $S_{11}$ response of the detection coil with and without the presence of the LC sensor 20 was recorded and is shown in FIG. 4. The resonant frequency of the sensor was measured to be 34.2 MHz. A computer (PC) 40 was utilized for data collection and post-processing.

Results and Discussion

Figure 5:
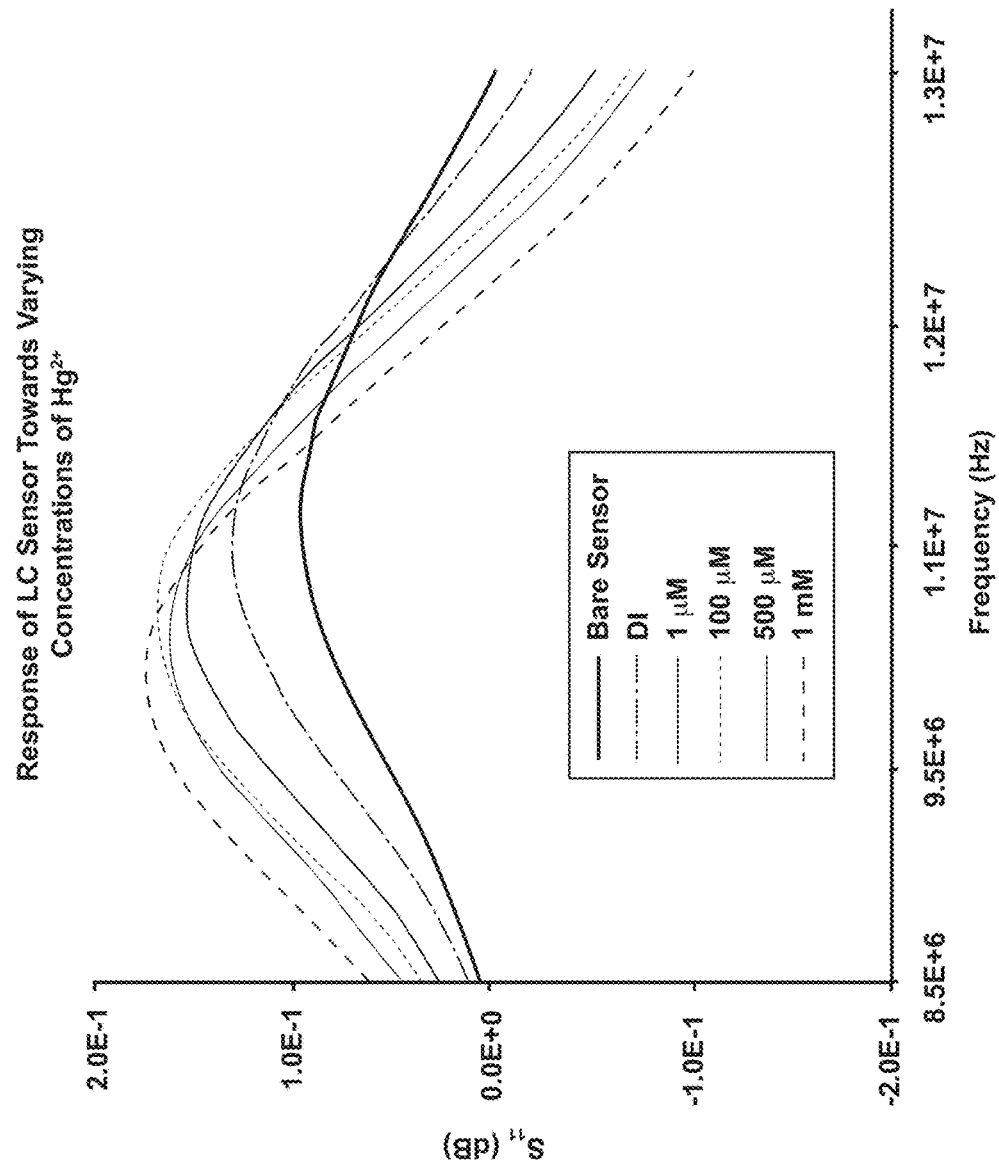
FIG. 5 is a graph showing the response of an LC sensor towards varying concentrations of $Hg^{2+}$.

The $S_{11}$ response of the Pd NP drop casted sensor 15 was first tested towards different concentrations of $Hg^{2+}$ Initially, a reference signal was established by loading 50 µL of deionized (DI) water onto the sensor using a pipette. Then, 50 µL of test sample solutions with varying concentrations of $Hg^{2+}$ were introduced onto the sensor 15. The response of the printed LC sensor 15 to changes in concentration of $Hg^{2+}$ is shown in FIG. 5. It was observed that the average change in the resonant frequency of the LC sensor 15 was 86.9 kHz, 92.6 kHz, 0.4 MHz and 0.93 MHz, with an average standard deviation of 9 kHz, 2.9 kHz, 58.9 kHz and 0.29 MHz for 50 µM, 100 µM, 500 µM and 1 Mm concentrations, respectively, when compared to the established reference signal of DI water. The change in the resonant frequency of the Pd NP based sensor 15 towards varying concentrations of heavy metal ions is believed to be related to the change in dielectric constant of the Pd NPs. Increased concentration of $Hg^{2+}$ influences and changes the dielectric constant of the metallic nanoparticle surface, which in turn changes the capacitance of the sensor 15. This change in the dielectric constant is due to the formation of metal oxides when the metallic nanoparticles react with the heavy metals.

Figure 6:
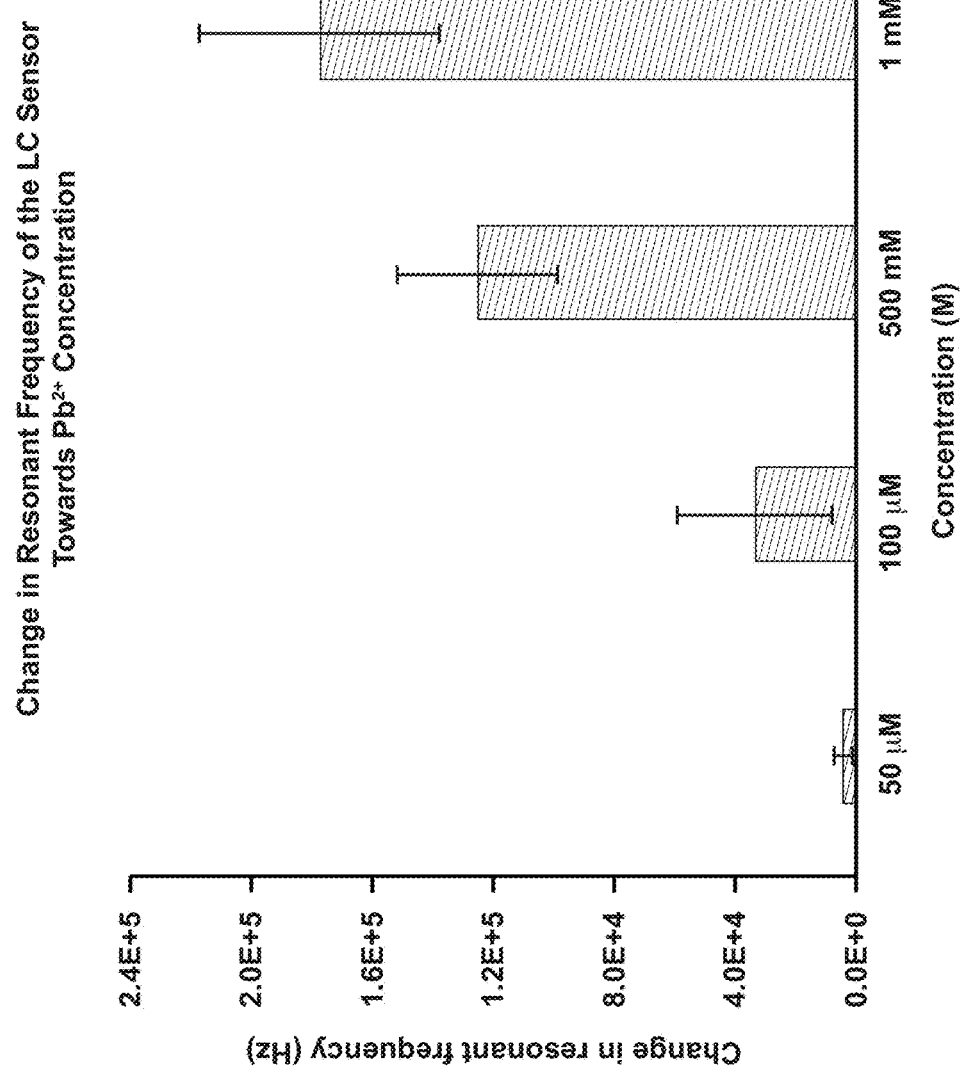
FIG. 6 is a graph showing change in resonant frequency of the LC sensor towards $Pb^{2+}$.

The response and sensitivity of the Pd NP drop casted sensor 15 was then tested towards $Pb^{2+}$ (FIG. 6) Test sample solutions with varying concentrations of $Pb^{2+}$ were introduced onto the sensor 15. Average resonant frequency changes of 4.2±2.9 kHz, 33.3±25.7 kHz, 125±26.5 kHz and 177±39.6 kHz were measured for the 50 μM, 100 μM, 500 μM and 1 mM concentrations of $Pb^{2+}$, respectively. The wireless frequency response of the printed LC sensor 15 demonstrated a detection level as low as 50 μM and the capability of the printed LC sensor 15 to distinguish among a wide range (micro and milli level) of sample concentrations.

To summarize, a printed LC sensor 15 was successfully fabricated on flexible PET substrate using a traditional screen printing process. Silver based flake ink was used for fabricating/metallizing the planar inductor 10 and capacitor 20. The planar inductor 10 includes 20 turns, 175 μm line width and spacing, 43 mm outer width and 22 mm inner width. The IDEs of capacitor 20 have 9 pairs of electrodes 22 and 24, with electrode dimensions of 5200 μm length, 200 μm width and spacing. Pd NPs were synthesized and used as sensing layer for $Pb^{2+}$ and $Hg^{2+}$. The change in resonant frequency of the LC sensor 15 with varying concentrations of heavy metals ions was recorded. Quantitative detection of $Pb^{2+}$ and $Hg^{2+}$ was made possible for concentrations as low as 50 μM. The LC sensor 15 also has concentration specific signals toward $Pb^{2+}$ and $Hg^{2+}$, which is necessary for devices that can determine the amount of possible exposure levels.

It will be understood that the LC sensor 15 could be utilized to detect other heavy metals (e.g. metals with atom weight greater than sodium) and metalloids. The sensor 15 may also be utilized to detect other elements (i.e. elements that are not heavy metals), provided the elements change the capacitance of the LC sensor 15.

Also, the functional inks used for the printed inductors could be replaced with nickel iron (NiFe) which has high permeability, resulting in higher inductance values with the same dimensions. Different materials for the sensing layers such as gold nanoparticles and/or silver nanoparticles could also be utilized. Furthermore, the Pd NPs and/or metallic nanoparticles could be synthesized as functional inks and directly printed as sensing layers on IDES.

It is to be understood that variations and modifications can be made on the aforementioned structure without departing from the concepts of the present invention, and further it is to be understood that such concepts are intended to be covered by the following claims unless these claims by their language expressly state otherwise.

The invention claimed is:

1. A method of fabricating an inductive-capacitive (LC) sensor, the method comprising:
    depositing a layer of electrically conductive material on an electrically non-conductive substrate to form an inductor;
    depositing a layer of electrically conductive material on an electrically non-conductive substrate to form interdigitated electrodes (IDE) defining a capacitor;
    depositing nanoparticles having a diameter of 1-2 nm onto at least a portion of the IDEs to form at least one sensing layer;
    wherein the nanoparticles comprise at least partially conductive materials having electrochemical properties, such that the response of the LC sensor varies when heavy metal particles are present.

2. The method of claim 1, wherein:
the nanoparticles comprise palladium.

3. The method of claim 1, wherein:
the nanoparticles are substantially spherical.

4. The method of claim 1, wherein:
The layers of electrically conductive material forming the inductor and the capacitor are deposited utilizing a screen printing process.

5. The method of claim 1, including:
electrically interconnecting the inductor and the capacitor in parallel;
positioning a sensing coil adjacent the inductor.

6. The method of claim 1, wherein:
the nanoparticles are deposited utilizing a drop casting process.

7. The method of claim 1, wherein:
the nanoparticles are deposited utilizing a printing process.

8. The method of claim 1, wherein:
the nanoparticles comprise one or more of palladium, gold, and silver.

9. The method of claim 1, wherein:
the nanoparticles comprise a metal having a surface that forms metal oxides when the surfaces of the nanoparticles are exposed to a solution having increased concentration of $Hg^{2+}$ whereby the capacitance of the sensor changes.

10. The method of claim 1, wherein:
the metal nanoparticles comprise palladium.

11. An inductive-capacitive (LC) sensor, comprising:
an electrically conductive material disposed on an electrically non-conductive substrate to form an inductor;
an electrically conductive material disposed on an electrically non-conductive substrate to form a capacitor;
a sensing layer comprising substantially spherical nanoparticles disposed on at least a portion of the conductive material of the capacitor, wherein the nanoparticles have electrochemical properties such that the electrical response of the LC sensor varies when heavy metal particles are present.

12. The LC sensor of claim 11, wherein:
the nanoparticles have a diameter of 1-2 nm.

13. The LC sensor of claim 11, wherein:
the nanoparticles comprise one or more of palladium, gold, and silver.

14. The LC sensor of claim 11, wherein:
the inductor and the capacitor are electrically connected in parallel; and including:
a sensing coil positioned adjacent the inductor.

15. The LC sensor of claim 11, wherein:
the inductor comprises a flat coil having about a 175 μm conductor line width, about 350 μm spacing, about 43,000 μm outer diameter, about 22,000 μm inner diameter, and about 20 turns.

16. The LC sensor of claim 11, wherein:
the capacitor comprises interdigitated coplanar electrodes having an area of about 6.5 mm by 6.5 mm.

17. The LC sensor of claim 11, wherein:
the nanoparticles comprise palladium.

18. A method of fabricating an inductive-capacitive (LC) sensor, the method comprising:
    printing a layer of electrically conductive material on a substrate to form an inductor;
    printing a layer of electrically conductive material on a substrate to form a capacitor;
    depositing metal nanoparticles onto at least a portion of the capacitor to form at least one sensing layer, wherein the metal nanoparticles have electrochemical properties whereby surfaces of the metal nanoparticles react with heavy metal ions in solution to form metal oxides that change a capacitance of the sensor such that the electrical response of the LC sensor varies when heavy metal particles are present.

19. The method of claim 18, wherein:
the metal nanoparticles are substantially spherical.

20. The method of claim 18, wherein:
the metal nanoparticles have a diameter of 1-2 nm.

* * * * *